United States Patent [19]
Kalnitsky et al.

[11] Patent Number: 4,868,618
[45] Date of Patent: Sep. 19, 1989

[54] ION IMPLANTED SEMICONDUCTOR DEVICE

[75] Inventors: Alexander Kalnitsky, Ottawa; Michael I. H. King, Nepean; Robert A. Hadaway, Ottawa, all of Canada

[73] Assignee: Northern Telecom Limited, Montreal, Canada

[21] Appl. No.: 174,260

[22] Filed: Mar. 25, 1988

[51] Int. Cl.$^4$ .................................... H01L 29/78
[52] U.S. Cl. .............................. 357/23.5; 357/23.1; 357/23.12; 357/23.14
[58] Field of Search ................ 357/23.5, 23.12, 23.1, 357/23.14, 52

[56] References Cited

U.S. PATENT DOCUMENTS

| | | |
|---|---|---|
| Re. 31,083 | 11/1982 | DeKeersmaecker et al. |
| 4,344,222 | 8/1982 | Bergeron . |
| 4,432,072 | 2/1984 | Chao . |
| 4,458,407 | 7/1984 | Hoeg .................... 357/23.5 |
| 4,471,471 | 9/1984 | DiMaria . |
| 4,656,729 | 3/1987 | Kroll ..................... 357/23.5 |
| 4,717,943 | 1/1988 | Wolf ...................... 357/23.5 |
| 4,733,482 | 3/1988 | West ..................... 357/23.5 |

Primary Examiner—Martin H. Edlow
Attorney, Agent, or Firm—John E. Mowle

[57] ABSTRACT

A conductor-dielectric-semiconductor device and a method of making such a device which has an insulating silicon-dioxide dielectric layer on a silicon substrate, and a conductive layer over a region of the dielectric layer. Silicon ions have been implanted into the region under the conductive layer. Depending upon the thickness of the region and the concentration of implanted silicon ions, the device can function as an IGFET memory device or a vertical resistor between the conductive layer and the substrate.

6 Claims, 3 Drawing Sheets

ION IMPLANTED SEMICONDUCTOR DEVICE

This invention relates to a semiconductor device and more particularly to one having implanted ions in a dielectric layer thereof, which form induced traps that function as the charge storage media in non-volatile random access memory devices or alternatively, that enhance conduction of the dielectric layer to form vertical resistors. Such memory devices are also known under the names of electrically alterable read only memory (EAROM) and electrically eraseable programmable read only memory (EEPROM).

BACKGROUND OF THE INVENTION

Charge stored directly above the channel areas of insulated gate field effect transistors (IGFETs) are known to result in modulation of the IGFET's conductance. This phenomenon is successfully utilized in the manufacturing of EEPROM devices. An EEPROM device comprises a means of charge storage and a means of generating and transporting charge to the charge storage site. The stored charge modulates the channel conductance of the IGFET in such a manner as to achieve a programmed or an erased state of the device.

While an IGFET based memory device can be programmed and erased in a variety of ways, only two basic types of charge storage media can be identified. The charge (information) can be stored on a floating (isolated) gate or in traps purposely introduced in the gate dielectric. Examples of floating gate memory devices are described in U.S. Pat. No. 4,471,471 by Donelli J. DiMaria, issued Sept. 11, 1984; and U.S. Pat. No. 4,432,072 by Hu H. Chao et al, issued Feb. 14, 1984.

The subject of the present invention is a "floating trap" type charge storage media and a memory device utilizing this charge storage media. Introduction of deep traps in a dielectric is commonly achieved by creating a hetero-dielectric structure such as described in U.S. Pat. No. 4,344,222 by David L. Bergeron, issued Aug. 17, 1982. It is also possible, however, to create deep traps by ion implantation of an impurity such as arsenic (As) into the dielectric. Silicon devices (Si) made using such a process are described in U.S. Pat. No. Re. 31,083 by Roger F. DeKeersmaecker et al, issued Nov. 16, 1982.

It has been found that the manufacture of such devices requires high doses of implanted species so that a sufficient number of traps remain after a high temperature annealing process which is required during IGFET fabrication. High doses of implanted arsenic (or other material such as P, Al, W) cannot be adequately confined to a thin dielectric layer due to range straggle and other artifacts of the implantation and subsequent anneal processes. Consequently, some of the species being implanted penetrate the underlying semiconductor substrate resulting in undesirable counter-doping effects. These considerations limited the useful range of dielectric thicknesses to a minimum of approximately 500 Angstroms in prior art devices such as described in U.S. Pat. No. Re 31,083. Furthermore in order to reduce the operating voltages required to transport charge to and from implant induced traps in the devices shown in this patent, additional layers had to be introduced in the gate dielectric to improve charge injection efficiency. The additional layers described in U.S. Pat. No. Re 31,083 are referred to as graded band gap (or stepped band gap) injectors.

STATEMENT OF THE INVENTION

It has been found that implanting silicon ions into the silicon dioxide dielectric results in charge traps in this dielectric that can be utilized to provide a simple charge-storage cell which does not require either a floating gate or a hetero-dielectric trapping interface. Unlike in previous devices which utilized controlled impurity ion-implantation, the penetration of the Si ions into the Si substrate does not result in undesirable changes in the substrate's doping. Consequently, thinner gate oxide layers can be utilized, hence reducing the operating voltages and eliminating the need for additional injector forming layers. The implantation of positive silicon ions in the silicon dioxide can also be used to enhance the conduction of the implanted dioxide dielectric so as to form a controlled resistance across the dielectric.

Thus, in accordance with the present invention there is provided a method of making a semiconductor device which comprises the steps of providing a silicon substrate having a channel region; forming an insulating silicon-dioxide layer on a surface of the silicon substrate having a dielectric gate region overlying the channel region; implanting silicon ions in the dielectric gate region to form traps in the gate dielectric region, with the maximum density of the ions being displaced from the surface of the silicon substrate.

In a particular embodiment the method comprises the additional step of implanting source and drain regions with appropriate ions in the active device region, using the gate electrode layer as a mask so that these source and drain regions together with the gate layer provide an insulated-gate field-effect-transistor (IGFET) which will function as an EAROM device.

The present invention also provides a conductor-dielectric-semiconductor device comprising a silicon substrate having a channel region, an insulating silicon-dioxide layer on a surface of the silicon substrate having a dielectric gate region overlying the channel region, and a conductive gate layer over a portion of the dielectric gate region. It is characterized by implanted silicon ions in the dielectric gate region, under the region of the conductive gate layer, with the maximum density of the ions being towards but not contiguous the surface of the silicon substrate.

In a particular embodiment the invention includes an IGFET memory device comprising: a silicon substrate having a channel region; an insulating silicon-dioxide layer over the silicon substrate having a gate oxide region overlying the channel region; a conductive gate layer over a portion of the gate oxide region; and source and drain regions in the channel region. The device is characterized by implanted silicon ions in the gate oxide region under the region of the conductive gate, of between about 0.1 and $20 \times 10^{15}$ ions/cm$^2$ forming silicon dioxide traps in the gate oxide region.

BRIEF DESCRIPTION OF THE DRAWINGS

Example embodiments of the invention will now be described with reference to the accompanying drawings in which.

DETAILED DESCRIPTION OF THE DRAWINGS

Figure 1:
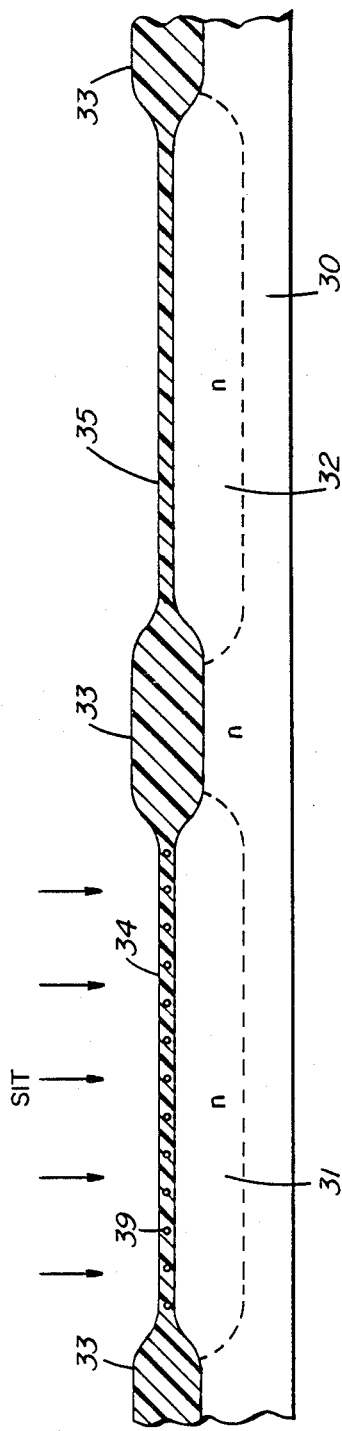
FIG. 1 is a partial cross-sectional view illustrating a partially completed standard field-effect transistor and a field-effect transistor which will function as a memory device.

Referring to FIG. 1, there is shown two partially formed IGFETs, the left hand one of which will form a memory device. As will be manifest in the following description, it can also function as a vertical resistor. Both of these devices are of the p-channel type. It will be evident that n-type channel devices can also be made which perform a similar function. In the following description this alternative form of the device will be referred to but is not specifically shown in the drawings. In the present embodiment, both a memory device and an ordinary IGFET are constructed in a twin tub technology on a Si (100) substrate 30 having n-type channel regions 31, 32. Both n-channel and p-channel memory devices can be processed simultaneously.

An insulating $SiO_2$ layer 33 having thin dielectric gate regions 34 and 35 overlying respective channel regions 31 and 32 in the substrate 30, is thermally grown on the substrate 30 using standard processing techniques. In the present embodiment both oxide regions 34 and 35 have a nominal thickness of 25 nm.

After masking, again using standard processing techniques, the dielectric region 34 is implanted with about $2 \times 10^{15}$ positive silicon ions/cm$^2$ at an energy of about or below 25 keV to form induced traps 39. The parameters are selected so that the highest concentration of ions is near, but not contiguous to the interface between the regions 31 and 34. Optimally, a distance greater than 7 nm from the interface is sought. In addition, the distance between the highest concentration of ions and the upper surface of the gate region 34 is greater than the distance from the higest concentration of ions to the interface. The zone of peak ion density is controlled by the implant energy, i.e. the higher the energy the further the peak from the $SiO_2$ surface. Since the use of a thicker (35–50 nm) gate oxide region 34 requires higher voltages to program or erase the memory device, the practical limits for oxide thickness are about 10 nm to 50 nm, with a result that the practical range of silicon implant doses is between about 0.1 and $20 \times 10^{15}$ ions/cm$^2$ and the practical range of energies between 6 and 40 keV.

Following the implantation step, the device is given a post implant anneal. A post implant anneal in diluted oxygen (0.1 to 1% $O_2$ in inert gas) at 800 deg.C to 1000 deg.C for 1 to 45 minutes was found to be effective in the processing of high dose ($8 \times 10^{15}$ ions/cm$^2$ or greater) implanted devices. For devices implanted with lower doses of silicon ions, a special anneal step is not necessary.

Figure 2:
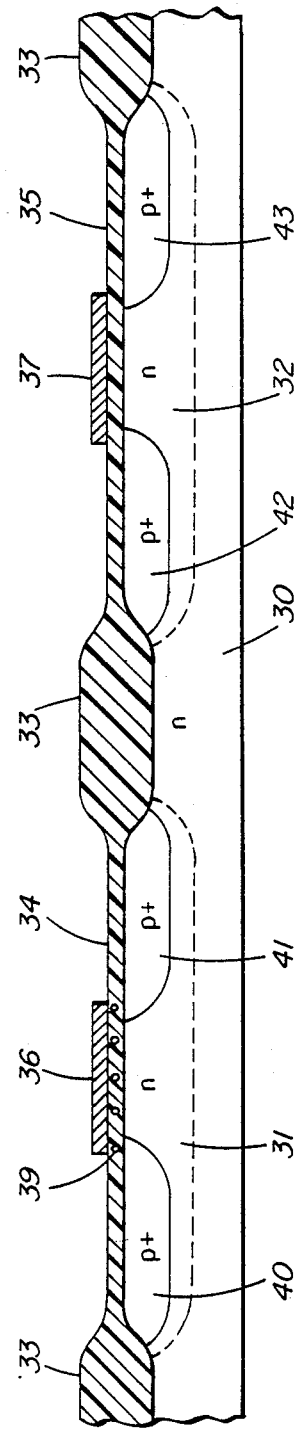
FIG. 2 shows the completed field effect transistor and the memory device illustrated in FIG. 1.

Referring to FIG. 2, after silicon ion implantation and optional annealing, polysilicon gates 36 and 37 are formed over the dielectric gate regions 34 and 35, again using standard processing techniques. P+ type source and drain regions 40, 41, and 42, 43 respectively, are then formed using standard ion implantation techiques in the channel regions 31 and 32 using the gates 36 and 37 as masks. This is again followed by a high temperature anneal which diffuses the dopants into the channel regions 31 and 32. This and further processing steps eliminate any exposed silicon ions 39. For example, the oxide regions 34, 35 over the source and drains 40, 41, and 42, 43, can be stripped off and regrown to eliminate any implanted ions over the diffused regions. However, those directly beneath the gate 36 remain, as shown in FIG. 2. As a result a standard IGFET device 50, as well as an IGFET memory device 51, which displays memory properties due to the presence of silicon implant induced traps 39 in the dielectric 34, are both formed.

To alter the conducting properties of the memory device 51, charge must be transported to or removed from the implant induced traps. For a 25 nm thick gate oxide region 34 a +12 to +25V pulse is applied for a period of less than 10 msec. to the gate 36 relative to the substrate 31. This results in electron injection from substrate 31 and electron trapping in the dielectric 34. Net negative charge stored in the gate 34 enhances conduction of the p-channel memory 51 device at fixed gate to source ($V_{GS}$) and drain to source ($V_{DS}$) voltages. Conversely it reduces the conduction of the alternative n-channel memory device not shown in the drawings. Efficient injection of electrons was achieved from both accumulated n-type and inverted p-type substrate regions 31.

Application of a negative voltage pulse of $-12$ to $-25V$ for less than 10 ms to gate 36 results in ejection of stored electrons and/or positive ionization of neutral traps. The resulting net positive charge stored in gate dielectric 34 reduces conduction of the p-channel device 51 and conversely enhances conduction of the alternative n-channel memory device (at fixed $V_{GS}$ and $V_{DS}$). Efficient generation of positive charge in gate 34 was achieved with both accumulated p-type and inverted n-type substrates. Other techniques such as hot carrier injection, can be utilized for operation of the present memory device. Hot carrier injection is achieved by application of high voltages to both gate and drain relative to source. This technique allows for efficient electron injection into the dielectric layer.

Figure 3:
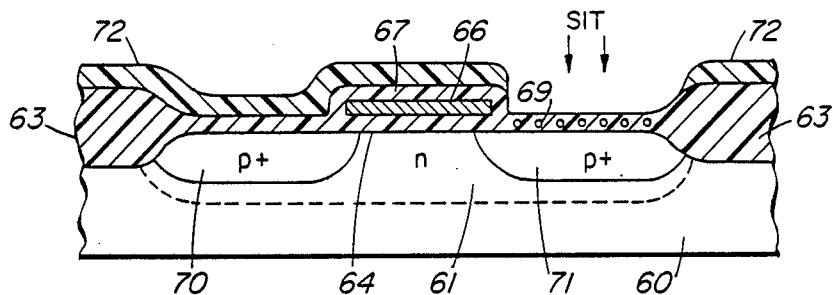
FIG. 3 is a partial cross-sectional view illustrating a partially completed field-effect transistor and vertical resistor combination.
Figure 4:
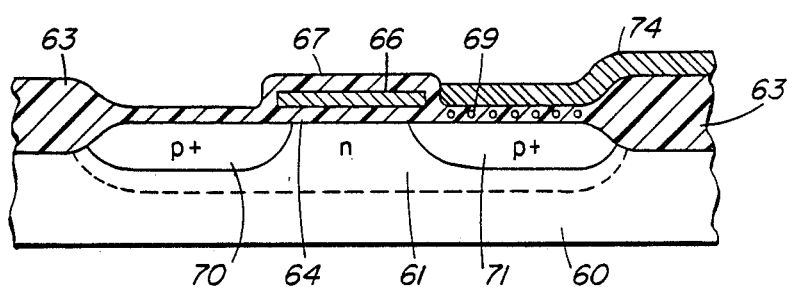
FIG. 4 shows the completed field-effect transistor and vertical resistor combination illustrated in FIG. 3.

Referring to FIGS. 3 and 4, there is illustrated a partial cross-sectional view of a field-effect transistor and vertical resistor combination. FIG. 3 illustrates the partially completed combination and shows a silicon (100) substrate 60 having an n-type channel region 61.

An insulating $SiO_2$ layer 63 having a thin dielectric gate region 64 overlying the channel region 61 in the substrate 60 is thermally grown on the substrate 60 using standard processing techniques. In this embodiment the oxide region 64 also has a nominal thickness of 25 nm with a range of about 4 nm to 50 nm. It will be noted that this range is somewhat broader than that which is used for a memory device.

A polysilicon gate 66 is formed over part of the gate region 64 again using standard processing techniques. P+-type source and drain regions 70 and 71 are then formed using standard ion implantation techniques in the channel 61 using the gate 66 and a standard mask (not shown) to define the regions. A further thin silicon dioxide layer 67 is then formed over the gate 66 and over the P+ region 71. Thus, after the source and drain regions 70, 71, are implanted and diffused (annealed) the thickness of the dielectric 64 over P+regions is not necessarily equal to the gate oxide thickness beneath the gate 66. It may be independently controlled by further processing.

A further mask 72 is then formed over the entire SiO$_2$ layer with the exception of the area over the implanted drain region 71. After masking, again using standard processing techniques, the dielectric region 63 over the drain region 71, is implanted with greater than about $5 \times 10^{15}$ positive silicon ions/cm$^2$ at an energy of about or below 25 keV to form ion traps 69. The parameters selected are essentially the same as those used with respect to the silicon ion implantation described with respect to FIGS. 1 and 2.

After the implantation step, the mask 72 is removed and a conductive layer 74 is formed on part of the gate region 64 over the drain region 71. This results in a controlled vertical resistor between the conductive layer 74 and the drain diffusion 71, as shown in FIG. 4.

Figure 5:
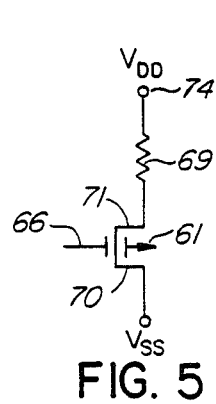
FIG. 5 is a schematic diagram of an inverter formed by a device illustrated in FIG. 4.

FIG. 5 illustrates a schematic diagram of a logic inverter formed by the semiconductor device illustrated in FIG. 4 with corresponding reference numerals being used to designate the equivalent schematic elements. The vertical integrated conductor described earlier with respect to FIG. 4 is compatible with any active unipolar or bipolar device formed using well known planar techniques.

Figure 6:
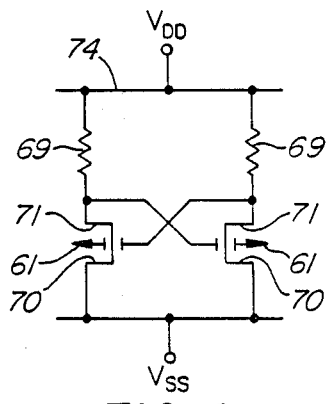
FIG. 6 is a schematic diagram of a static latch formed by two devices illustrated in FIG. 4.

Similarly, FIG. 6 is a schematic diagram of a static latch formed utilizing two devices of the type illustrated in FIG. 4, again having corresponding reference numerals. This configuration is useful in the design and fabrication of Static Random Access Memories (SRAMs).

Figure 7:
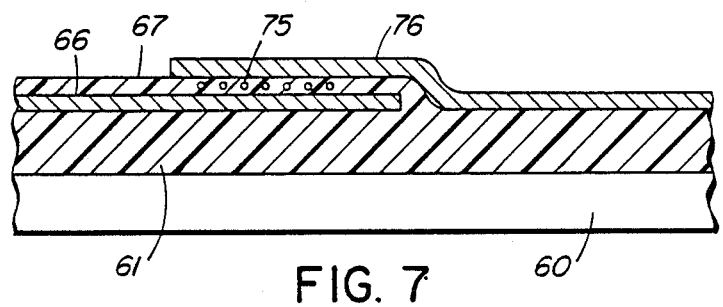
FIG. 7 is a partial cross-sectional view of a gate electrode device and vertical resistor combination.

FIG. 7 shows yet a further embodiment in which a vertical resistor is formed in series with the gate electrode 66. The reference numerals correspond with those illustrated in FIG. 4 with the exception that the silicon ions 75 are implanted in the silicon dioxide layer 67 and the conductive layer 76 is formed over this implanted region. The layer 67 is grown by conventional means on the polysilicon layer 66.

Thus by varying the density of the implanted silicon ions the device can also function as a vertical resistor between the gate 36 and the substrate region 31. For such a device, gate electrodes can be made out of metal as well as polysilicon. Substrate regions may be heavily doped and source/drain formation is not required.

Figure 8:
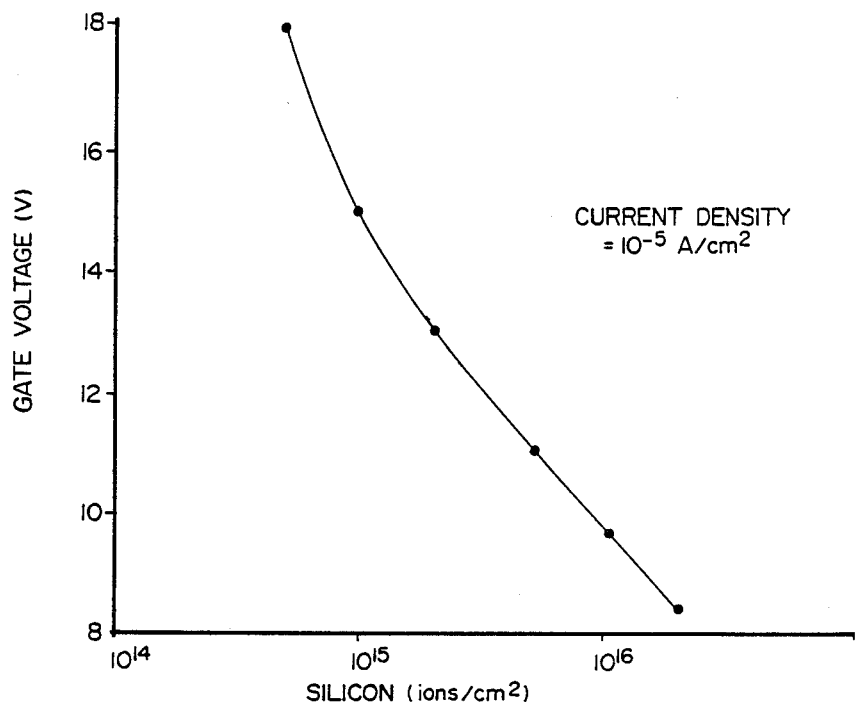
FIG. 8 is a plot of the gate voltage required to produce a particular current density for various implementation levels of the device shown in FIG. 2.
Figure 9:
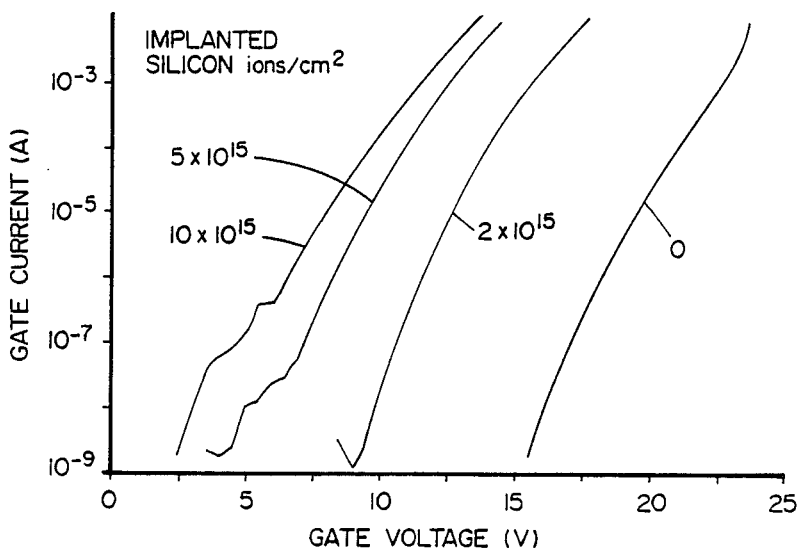
FIG. 9 illustrates the I–V characteristics of the device illustrated in FIG. 4 or 7 for various implantation levels.

FIG. 8 is a plot of voltage applied to the 23 nm thick gate 36 relative to the substrate 31, necessary to produce $10^{-5}$ A/cm$^2$ current density, for varying levels of implanted silicon ions for devices such as are shown in FIGS. 4 and 7. FIG. 9 is a plot of I-V characteristics for control (non-implanted) and silicon implanted oxides (2,5, $10 \times 10^{15}$ @ 25 keV). These graphs illustrate that, by varying implantation levels, the conductance characteristics of Si-rich oxides can be varied over a considerable range of applied voltages.

What is claimed is:

1. A conductor-dielectric-semiconductor device comprising:
   a silicon substrate having a channel region;
   an insulating silicon-dioxide layer on a surface of the silicon substrate having a dielectric gate region overlying the channel region;
   a conductive gate layer over a portion of the dielectric gate region; and
   implanted silicon ions in the dielectric gate region, under the region of the conductive gate layer, with the maximum density of the ions being towards but not contiguous the surface of the silicon substrate.

2. An IGFET memory device comprising:
   a semiconductor substrate having a channel region;
   an insulating silicon-dioxide layer on a surface of the silicon substrate having a gate oxide region overlying the channel region;
   a conductive gate layer over a portion of the gate oxide region;
   source and drain regions in the channel region; and
   implanted silicon ions in the gate oxide region, under the region of the conductive gate of between about 0.1 and $20 \times 10^{15}$ ions/cm$^2$ forming silicon dioxide traps in said gate oxide region, with the maximum density of the ions being displaced from the surface of the silicon substrate.

3. A device as defined in claim 2 in which the gate oxide region has a thickness of between about 10 and 50 nm and the maximum density of the implanted ions in the silicon dioxide is at a distance of at least about 3 to 7 nm from said surface of the silicon substrate.

4. A device as defined in claim 3 in which the distance from the maximum density of the ions to the conductive layer is greater than that from the maximum density of the ions to the surface of the silicon substrate.

5. An IGFET device comprising:
   a semiconductor substrate having a channel region;
   an insulating silicon-dioxide layer on a surface of the silicon substrate having an oxide region overlying the channel region;
   a first conductive gate layer over a portion of the oxide region;
   source and drain regions in the channel region contiguous the first conductive gate layer;
   a second conductive layer over another portion of the oxide region and the drain region; and
   implanted silicon ions in the oxide region, over the drain region of between about 5.0 and $20 \times 10^{15}$ ions/cm$^2$ forming silicon dioxide traps in said oxide region, with the maximum density of the ions being displaced from the surface of the silicon substrate.

6. An IGFET device comprising:
   a semiconductor substrate having a channel region;
   a first insulating silicon-dioxide layer on a surface of the silicon substrate having an oxide region overlying the channel region;
   a first conductive gate layer over a portion of the gate oxide region;
   a second insulating silicon-dioxide layer having an oxide region overlying the first conductive gate layer;
   implanted silicon ions in the oxide region of the second layer, and over the first conductive gate layer, of between about 5.0 and $20 \times 10^{15}$ ions/cm$^2$ forming silicon dioxide traps in said gate oxide region, with the maximum density of the ions being displaced from the surface of the silicon substrate.

* * * * *